US006849365B2

United States Patent
Schwarzl et al.

(10) Patent No.: US 6,849,365 B2
(45) Date of Patent: Feb. 1, 2005

(54) REFLECTION MASK FOR EUV-LITHOGRAPHY AND METHOD FOR FABRICATING THE REFLECTION MASK

(75) Inventors: Siegfried Schwarzl, Neubiberg (DE); Stefan Wurm, Dublin, CA (US)

(73) Assignee: Infineon Technologies AG, Munich (DE)

(*) Notice: Subject to any disclaimer, the term of this patent is extended or adjusted under 35 U.S.C. 154(b) by 116 days.

(21) Appl. No.: 10/292,866

(22) Filed: Nov. 12, 2002

(65) Prior Publication Data

US 2003/0091910 A1 May 15, 2003

(30) Foreign Application Priority Data

Nov. 9, 2001 (DE) .......................... 101 55 112

(51) Int. Cl.[7] .............................................. G03F 9/00
(52) U.S. Cl. ................................................ 430/5
(58) Field of Search ..................... 430/5, 322, 323; 378/34, 35

(56) References Cited

U.S. PATENT DOCUMENTS 5,304,437 A   4/1994  Tennant .......................... 430/5

6,641,959 B2 * 11/2003  Yan ................................ 430/5

FOREIGN PATENT DOCUMENTS

DE   38 56 054 T2   8/1988
EP   0 279 670 A2   8/1988

OTHER PUBLICATIONS

Bjorkholm, J. E.: "EUV Lithography—The Successor to Optical Lithography?", Intel Technology Journal, 3rd quarter 1998, pp. 1–10.

Yan, P.–Y. et al.: "EUV Mask Patterning Approaches", SPIE–Int. Soc. Opt. Eng., vol. 3676, Part 1–2, 1999, pp. 309–313.

* cited by examiner

Primary Examiner—S. Rosasco
(74) Attorney, Agent, or Firm—Laurence A. Greenberg; Werner H. Stemer; Ralph E. Locher

(57) ABSTRACT

A reflection mask has a multilayer reflection layer for the reflection of radiated-in radiation by constructive interference of the reflected partial beams and a multilayer layer, whose periodicity effects a destructive interference of the reflected partial beams and which performs the function of an absorber. One of the two multilayer layers is patterned in accordance with a structure to be imaged.

13 Claims, 8 Drawing Sheets

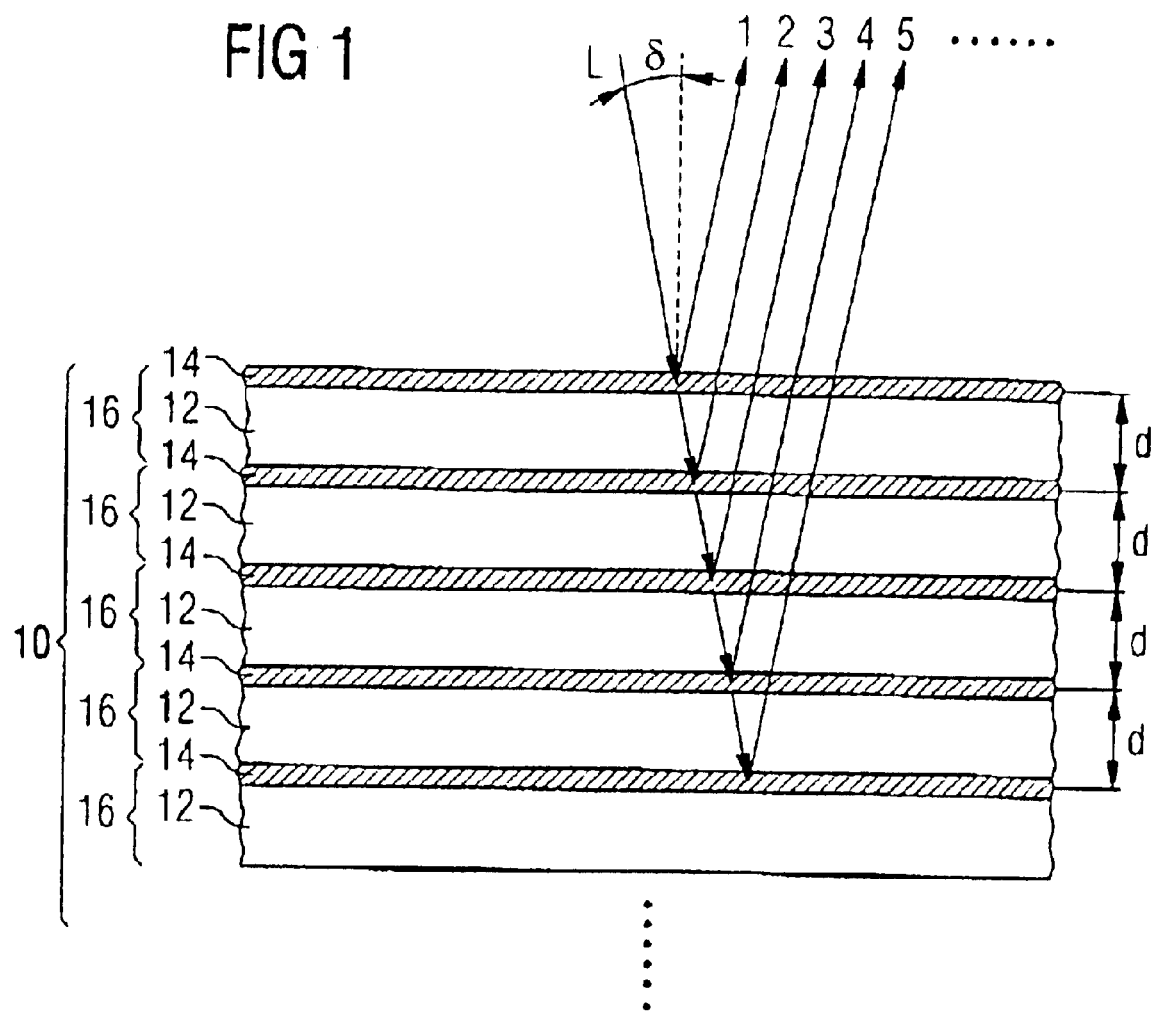

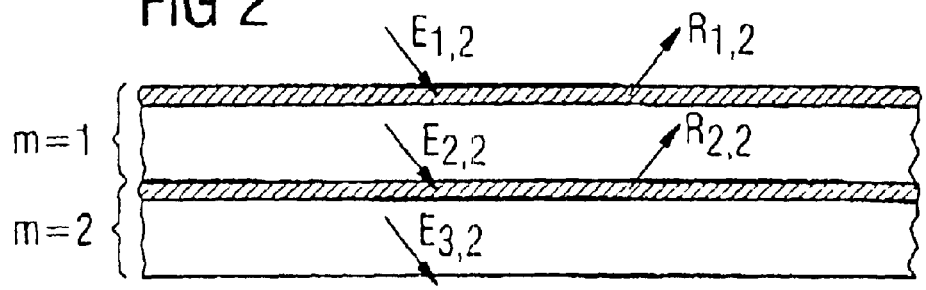
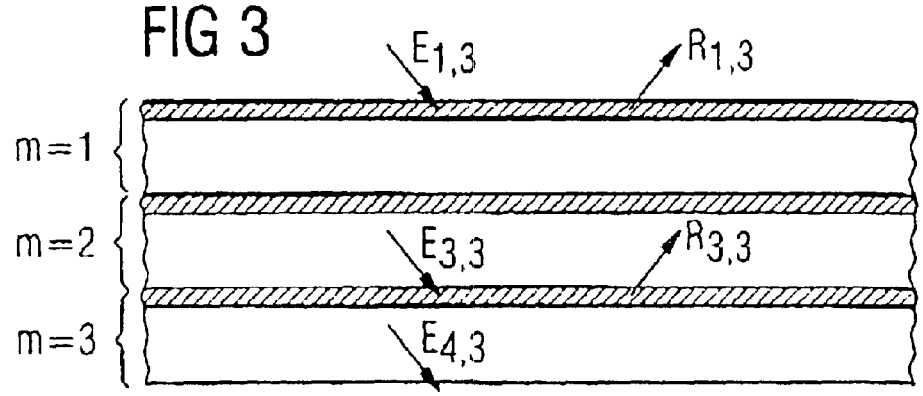
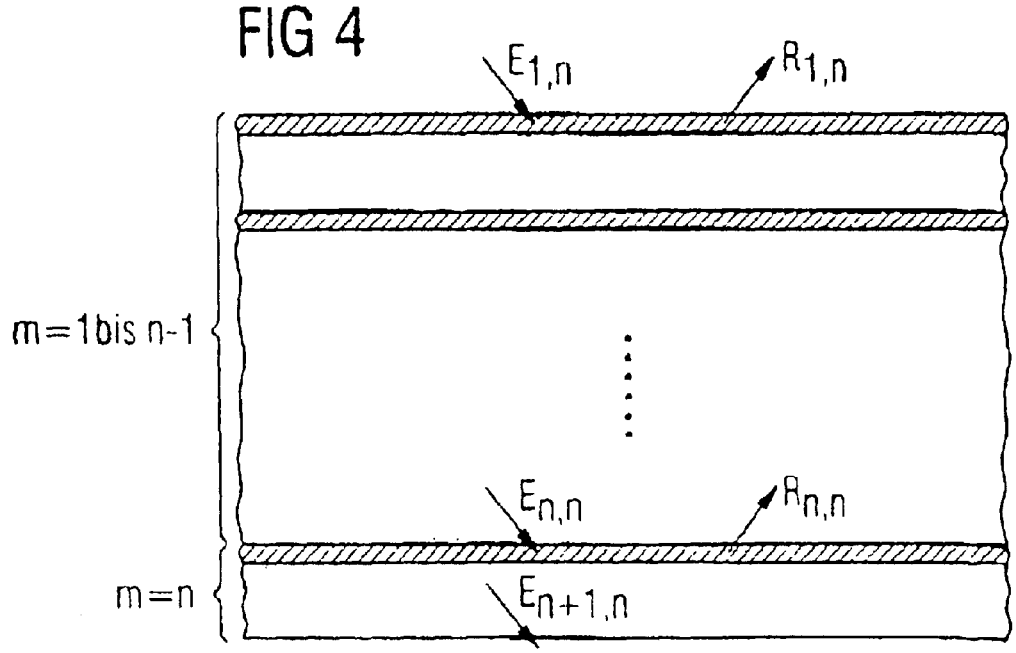

REFLECTION MASK FOR EUV-LITHOGRAPHY AND METHOD FOR FABRICATING THE REFLECTION MASK

BACKGROUND OF THE INVENTION

Field of the Invention

The invention relates to a reflection mask for EUV-lithography and a fabrication method therefor.

Hitherto, optical projection lithography with wavelengths into the ultraviolet region of approximately 200 nm has been used very successfully for the mass production of integrated semiconductor circuits. The lithography technology encounters its limits, however, at structural dimensions of the order of magnitude of 100 nm or less; smaller structures can thus no longer be imaged. However, circuits with structural dimensions of between 35 nm and 70 nm are already in development. To that end, it is also necessary to develop new lithography methods that replace the previous light-optical lithography technology.

One of the new methods is EUV-lithography (EUVL, Extreme Ultraviolet Lithography), which uses wavelengths in the range of soft X-rays between 10 nm and 15 nm for the projection imaging of the circuit structures.

To a certain extent, EUV-lithography can be considered as a natural extension of light-optical projection lithography since it uses radiation with a shorter wavelength than hitherto to image finer structures. However, there are a whole series of fundamental differences relative to the old technology. Many of these differences are based on the fact that the optical properties of bodies in the EUV region of the electromagnetic spectrum differ considerably from the properties of these bodies in the visible and UV regions.

Thus, EUV radiation is greatly absorbed in many materials, including gases. Installations for producing images using extreme ultraviolet radiation must therefore be operated in a vacuum. The absorption also makes it virtually impossible to use refractive optical elements such as lenses and transmission masks. The imaging systems in the EUV region must therefore be constructed from reflective elements. In the case of perpendicular or almost perpendicular incidence, however, the reflectivity of many materials for EUV radiation is also very low. In order to achieve reasonable reflectivities, the surfaces of the reflectors must be provided with a multiplicity of thin layers in order to obtain so-called Bragg reflection.

The masks for EUV-lithography are therefore reflection masks having a multilayer reflection layer. The structures on such a reflection mask are imaged onto the wafer by EUV-radiation that is directed onto the mask and selectively reflected there and a mirror optical configuration with a plurality of mirrors. It goes without saying that the reflectivity of the mask must be coordinated very precisely with the imaging system used.

Of course, reflection masks can be employed not only in EUV-lithography but, in principle, generally in all projection-lithographic methods.

Two EUV mask configurations with the corresponding fabrication processes have been disclosed hitherto. A first configuration relates to standard masks in which an absorber layer made of e.g. Cr is disposed above a reflective multilayer layer and is patterned by an absorber etching process and is described in the reference by John E. Bjorkholm, titled "EUV Lithography—The Successor to Optical Lithography?", Intel Technology Journal, 3rd quarter 1998).

A second configuration deals with masks that are patterned by the so-called damascene technique (by Pei-Yang Yan et al., titled "EUV Mask Patterning Approaches", SPIE-Int. Soc. Opt. Eng. 1999, Vol. 3676, Part 1–2, pages 309–313).

Both configurations have a whole series of disadvantages in each case.

The disadvantages of the first configuration are, besides shadowing effects due to the patterned absorber and buffer layers, distortions and overlay errors due to the different thermal expansion coefficients of the materials in or on the mask (substrate, multilayer reflection layer, buffer layer and absorber) on account of temperature gradients within the mask and different temperatures during the deposition of the materials, during the patterning of the absorber and during the use of the finished mask. Moreover, the thermal stresses induce and accelerate structural alterations such as recrystallization and diffusion in the multilayer reflection layer, as a result of which the reflectivity of the multilayer layer is altered locally and globally. The mask patterning method is highly complex in the case of this configuration, as a result of which the mask costs are very high.

The disadvantages of the second configuration are shadowing effects as in the first configuration, although to a smaller extent, and thermal effects as in the first configuration, the latter even considerably amplified. Primarily, however, in this case the application of new methods that have not been customary hitherto in mask technology, such as the highly conformal chemical vapor deposition (CVD) processes for absorber deposition and chemical mechanical polishing (CMP) of the damascene technique, leads to problems such as the production of defects in the multilayer reflection layer due to the CMP and a problematic defect repair after the CMP step. In this case, too, the mask is again of highly complex construction and thus very expensive.

SUMMARY OF THE INVENTION

It is accordingly an object of the invention to provide a reflection mask for EUV-lithography and a method for fabricating the reflection mask which overcome the above-mentioned disadvantages of the prior art devices and methods of this general type, which is also and particularly suitable for EUV-lithography and a fabrication method therefor.

With the foregoing and other objects in view there is provided, in accordance with the invention, a reflection mask for photolithography. The mask contains a first multilayer layer for reflecting radiated-in radiation by constructive interference of reflected partial beams, and a second multilayer layer having a periodicity effecting a destructive interference of the reflected partial beams and leads, in interaction with the first multilayer layer, to a local absorption of the radiated-in radiation.

The reflection mask according to the invention thus has not only a multilayer reflection layer for the reflection of radiated-in radiation by constructive interference of the reflected partial beams, but furthermore a further multilayer layer, which corresponds in principle to the multilayer reflection layer but whose periodicity effects a destructive, rather than a constructive, interference of the reflected partial beams and which performs the function of an absorber. One of the two multilayer layers is patterned in accordance with the structure that is to be imaged or transferred to the semiconductor wafer, so that the interaction of the two multilayer layers, the constructive and the destructive, yields the desired local absorption of the radiation radiated onto the mask.

The multilayer reflection layer or multilayer layer for the reflection of radiated-in radiation by constructive interference of the reflected partial beams is also called a constructive multilayer layer here for short, and the multilayer layer for the destructive interference of the reflected partial beams is also called a destructive multilayer layer here for short.

Both types of multilayer layers can be deposited continuously by the same method, for example by sputtering with different sputtering times or different substrate speeds.

Accordingly, the absorber layers used in the present invention are multilayer layers that are identical to the materials and the deposition methods for the conventional multilayer reflection layers with regard to the materials used and their deposition. The multilayer layers are configured as reflective or as absorptive layers merely through a suitable choice of the thickness of the double layers of which the multilayer layers are composed, that is to say the periodicity of the multilayer layers.

In the absorptive multilayer layers, the periodicity is chosen such that the reflected radiation is attenuated or extinguished by destructive interference. To that end, the thickness d of the individual double layers or the periodicity thereof must be an odd multiple of $\lambda/4$ for perpendicular light incidence. For oblique light incidence (angle of incidence $\delta>0$), the following must hold true: $d=(2n+1)\cdot\lambda/4\cdot\cos\delta$ ($n=0, 1, 2, 3 \ldots$).

For a constructive interference of the reflected beams, by contrast, the periodicity amounts to an integer multiple of $\lambda/2$ or $\lambda/2\cdot\cos\delta$, that is to say $d=n\cdot\lambda/2\cdot\cos\delta$ where $n=1, 2, 3$, etc.

Taking account of the phase angle of the partial beams, reflected and transmitted intensities of <1% can already be obtained for 16 double layers with extinction condition ($d=(2n+1)\cdot\lambda/4\cdot\cos\delta$ ($n=0, 1, 2, 3 \ldots$)).

In order to minimize the reflected radiation intensity, all the double layers of the destructive multilayer layer need not necessarily have a thickness $d=(2n+1)\cdot\lambda/4\cdot\cos\delta$ ($n=0, 1, 2, 3 \ldots$); it suffices if the 1st, 3rd, 5th, etc. double layer, counted from the top, has this thickness in order that the partial beams 1 and 2, 3 and 4, 5 and 6, etc. are in antiphase with respect to one another and compensate for one another.

The advantages of the invention are first that there is no need for a particular absorber material and thus a separate deposition process with dedicated installation therefor. The risk of faults such as extraneous particles on the masks decreases since a change of installation, etc. does not arise. The constructive and destructive multilayer layers are deposited in a continuous deposition process, the changeover from constructive to destructive and vice versa being able to be carried out very simply. The absorptivity achieved is very good (residual reflectivity of less than 1%). The costs for the masks are considerably reduced through the saving of time, material and equipment.

Moreover, in the case of the reflection mask for EUV-lithography, the intensity losses due to shadow effect are low owing to the positive effects of the laterally emerging scattered light, the "leaky waves", at the shadow sides of the patterned multilayer layer lying at the top.

In accordance with an added feature of the invention, a substrate is provided. The first multilayer layer is an unpatterned multilayer layer for the constructive interference of the reflected partial beams and is disposed on the substrate, and the second multilayer is a patterned multilayer layer for the destructive interference of the reflected partial beams and is disposed on the first multilayer layer.

In accordance with an additional feature of the invention, there is provided a substrate. The second multilayer layer is an unpatterned multilayer layer for the destructive interference of the reflected partial beams and is disposed on the substrate. The first multilayer layer is a patterned multilayer layer for the constructive interference of the reflected partial beams and is disposed on the second multilayer layer.

In accordance with a further feature of the invention, a buffer layer lies between the unpatterned and patterned multilayer layers.

In accordance with another feature of the invention, a further patterned buffer layer lies on the patterned multilayer layer and the further patterned buffer layer serves as an etching mask for the patterning of the patterned multilayer layer and is useful for defect repair.

Other features which are considered as characteristic for the invention are set forth in the appended claims.

Although the invention is illustrated and described herein as embodied in a reflection mask for EUV-lithography and a method for fabricating the reflection mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view showing a scheme of Bragg reflection formed by a multilayer layer according to the invention;

FIG. 2 is a sectional view useful for deriving recursive equations for the reflected and transmitted field strengths for the multilayer layer containing two double layers;

FIG. 3 is a sectional view useful for deriving the recursive equations for the reflected and transmitted field strengths for the multilayer layer containing three double layers;

FIG. 4 is a sectional view useful for deriving the recursive equations for the reflected and transmitted field strengths for the multilayer layer containing n double layers;

DESCRIPTION OF THE PREFERRED EMBODIMENTS

Figure 5A:
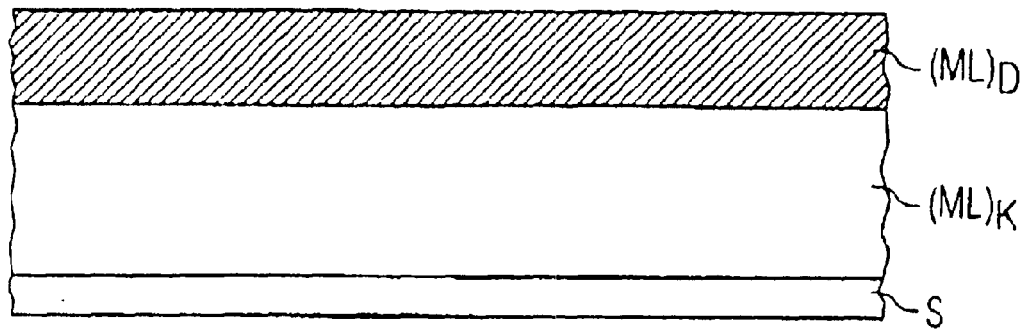
FIGS. 5A to 5C are diagrammatic, cross-sectional views through a mask for EUV-lithography of different fabrication stages, the mask containing an unpatterned constructive multilayer layer and a patterned destructive multilayer layer.

Referring now to the figures of the drawing in detail and first, particularly, to FIG. 1 thereof, there is shown a beam L which is incident on a multilayer layer (ML) 10 at an angle of incidence δ. The multilayer layer 10 contains a multiplicity of alternate individual layers 12, 14 made of materials with different optical constants in the EUV-region. A respective individual layer 12 made of one material and the subsequent individual layer 14 made of the other material produce a double layer 16. Depending on a thickness d of the individual double layers 16, that is to say on the periodicity d of the double layers, the multilayer layer 10 containing many such double layers 16 exhibits a constructive or destructive resonance behavior with regard to the radiated-in radiation. The resonance behavior is known as Bragg reflection.

The alternate individual layers 12, 14 of the double layers 16 of the EUV multilayer reflector are composed, for example, of the materials Si and Mo. Such layers can be optimized well for wavelengths of between 10 and 15 nm.

For a constructive interference of the partial beams 1, 2, 3, 4, 5 . . . reflected at the individual double layers 16 of the multilayer layer 10, the thickness d of the double layers 16, that is to say the periodicity d of the multilayer layer 10 containing many such double layers 16, must satisfy the condition d=n·λ/2·cos δ where n=1, 2, 3 . . . , in order that the phase differences between the partial beams are an integer multiple of 2π or their path differences Δ are equal to an integer multiple of λ, that is to say that Δ=n·2d/cos δ=nλ (n=1, 2, 3 . . . ). δ is the angle of incidence of the incident beam L.

If the periodicity d of the multilayer layer is an odd multiple of λ/4·cos δ, that is to say if the thickness of periodicity d of the double layers 16 satisfies the condition d=(2n+1)·λ/4·cos δ where n=0, 1, 2, 3 . . . , the partial beams 1 and 2 (and the partial beams 3 and 4, 5 and 6, etc.) are in antiphase with a phase shift π and almost extinguish one another since the path difference Δ between the partial beams is an odd multiple of λ/2 (Δ=2d/cos δ=(2n+1)λ/2), but their amplitudes differ somewhat.

For this destructive interference of the reflected partial beams, all the double layers 16 need not necessarily have a thickness d=(2n+1)·λ/4·cos δ; it suffices if the 1st, 3rd, 5th, etc. double layer 16, counted from the top, has this thickness in order that the partial beams 1 and 2, 3 and 4, 5 and 6, etc. are in antiphase with respect to one another.

Reference will now be made to FIGS. 2, 3 and 4 to explain the derivation of the recursive equations for the reflected field strengths R and the incident or transmitted field strengths E for a multilayer layer containing two (FIG. 2), three (FIG. 3) or n (FIG. 4) double layers 16.

In this case, the first index of doubly indexed variables relates to the number m of the double layer and the second index relates to the total number of double layers. The variables $r_m$ and $t_m$ specify the reflectivities and transmissivities, respectively, relative to the field strength, which, in terms of magnitude, are assumed to be identical for all the double layers ($|r_m|=r$, $|t_m|=t$). Consideration should be given to the signs of $r_m$ and $t_m$, which result from the continuity condition of the tangential field strength components at the interfaces.

With the absorptivity $a_m$, the following generally holds true for the considerations below:

$|r_m|+|t_m|+|a_m|=1$ $r_m<1$ $t_m>1$

The reflectivity r, the transmissivity t and the absorptivity a can be varied within wide ranges through the choice of the layer thickness ratio of the individual layers 12, 14 in a double layer 16.

For the transmitted field strengths E and the reflected field strengths R, the following relationships result for the case in FIG. 2 of two double layers:

$$R_{1,2}=E_{1,2}r_1+R_{2,2}t_1 \quad (1)$$

$$E_{2,2}=E_{1,2}t_1+R_{2,2}r_1 \quad (2)$$

$$R_{2,2}=E_{2,2}r_2 \quad (3)$$

$$E_{3,2}=E_{2,2}t_2 \quad (4).$$

Combining equations (2) and (3), and equations (5) and (3), gives $$E_{2,2}=E_{1,2}t_1/(1-r_1r_2) \quad (5)$$

$$R_{2,2}=E_{1,2}t_1r_2/(1-r_1r_2) \quad (6).$$

From (6) and (1), and (5) and (4), the following then results $$R_{1,2}/E_{1,2}=r_{1,2}=r_1+t_1^2r_2/(1-r_1r_2) \quad (7)$$

$$E_{3,2}/E_{1,2}=t_{1,2}=t_1t_2/(1-r_1r_2) \quad (8).$$

For the case in FIG. 3 of three double layers, with the assignments $E_{1,2} \leftrightarrows E_{1,3}$, $R_{1,2} \leftrightarrows R_{1,3}$, $E_{2,2} \leftrightarrows E_{3,3}$, $R_{2,2} \leftrightarrows R_{3,3}$, $E_{3,2} \leftrightarrows E_{4,3}$, $r_{1,1}=r_1=r \leftrightarrows r_{1,2}$, $t_{1,1}=t_1=t \leftrightarrows t_{1,2}$, $r_2 \leftrightarrows r_3$, $t_2 \leftrightarrows t_3$, $r_{1,2} \leftrightarrows r_{1,3}$ and $t_{1,2} \leftrightarrows t_{1,3}$, there follow from the above equations (1') to (4'):

$$R_{1,3}=E_{1,3}r_{1,2}+R_{3,3}t_{1,2} \quad (1')$$

$$E_{3,3}=E_{1,3}t_{1,2}+R_{3,3}r_{1,2} \quad (2')$$

$$R_{3,3}=E_{3,3}r_3 \quad (3')$$

$$E_{4,3}=E_{3,3}t_3 \quad (4').$$

Equations (7) and (8) become the following equations (9) and (10):

$$R_{1,3}/E_{1,3}=r_{1,3}=r_{1,2}+t_{1,2}^2r_3/(1-r_{1,2}r_3) \quad (9)$$

$$E_{4,3}/E_{1,3}=t_{1,3}=t_{1,2}t_3/(1-r_{1,2}r_3) \quad (10)$$

In the transition to n double layers (FIG. 4), with the assignments $E_{1,2} \leftrightarrows E_{1,n}$, $R_{1,2} \leftrightarrows R_{1,n}$, $E_{2,2} \leftrightarrows E_{n,n}$, $R_{2,2} \leftrightarrows R_{n,n}$, $E_{3,2} \leftrightarrows E_{n+1,n}$, $r_{1,1}=r_1=r \leftrightarrows r_{1,n-1}$, $t_{1,1}=t_1=t \leftrightarrows t_{1,n-1}$, $r_2 \leftrightarrows r_n=r$, $t_2 \leftrightarrows t_n=t$, $r_{1,2} \leftrightarrows r_{1,n}$ and $t_{1,2} \leftrightarrows t_{1,n}$, there follow from the equations (1") to (4"):

$$R_{1,n}=E_{1,n}r_{1,n-1}+R_{n,n}t_{1,n-1} \quad (1")$$

$$E_{n,n}=E_{1,n}t_{1,n-1}+R_{n,n}r_{1,n-1} \quad (2")$$

$$R_{n,n}=E_{n,n}r_n \quad (3")$$

$$E_{n+1,n}=E_{n,n}t_n \quad (4")$$

and from them $$R_{1,n}/E_{1,n}=r_{1,n}=r_{1,n-1}+t_{1,n-1}^2r_n/(1-r_{1,n-1}r_n) \quad (11)$$

$$E_{n+1,n}/E_{1,n}=t_{1,n}=t_{1,n-1}t_n/(1-r_{1,n-1}r_n) \quad (12)$$

In order to obtain the corresponding intensities, it is necessary to square the expressions (7), (8), (9), (10), (11), (12) for the field strengths.

If $t_m=te^{-i\pi/2}$ is set, then the phase shift of −90° corresponding to a path length of λ/4 is taken into account.

Application of $t_m$ two times (or six times, etc.) produces in-antiphase nature ($-180°$, $-540°$, etc.).

From equation (7), it follows for example for the reflectivity at two double layers with the extinction condition $d=(2n+1)\cdot\lambda/4\cdot\cos\delta$ ($n=0, 1, 2, 3 \ldots$) that $r_{1,2}=r-t^2r/(1-r^2)$. Given high transparency of the double layers ($t\leftrightarrow r$), $r_{1,2}\approx 0$ results, that is to say the layer system has a vanishingly small reflectivity. By repeated application of the recursion formulae (11) and (12), it follows that for wide ranges of values of the parameters r, t and a, reflected and transmitted intensities of less than 10% are already achieved starting from 10 to 16 double layers.

Figure 5B:
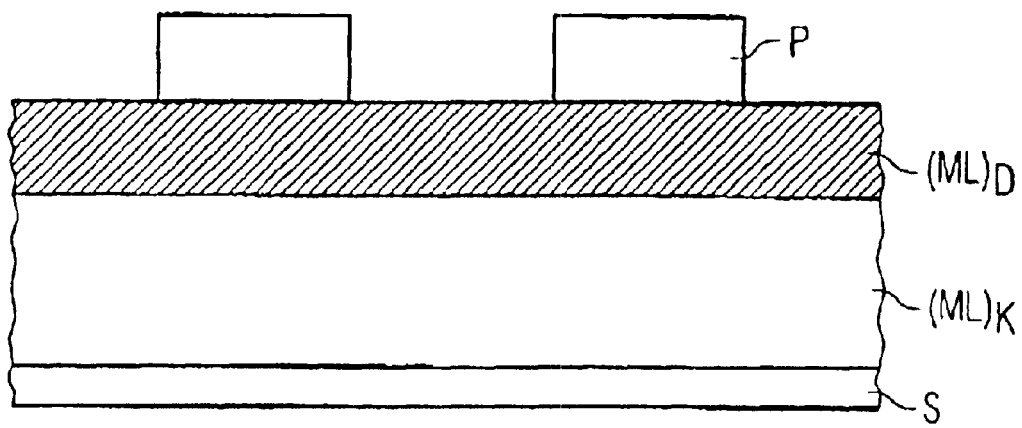
Figure 5C:
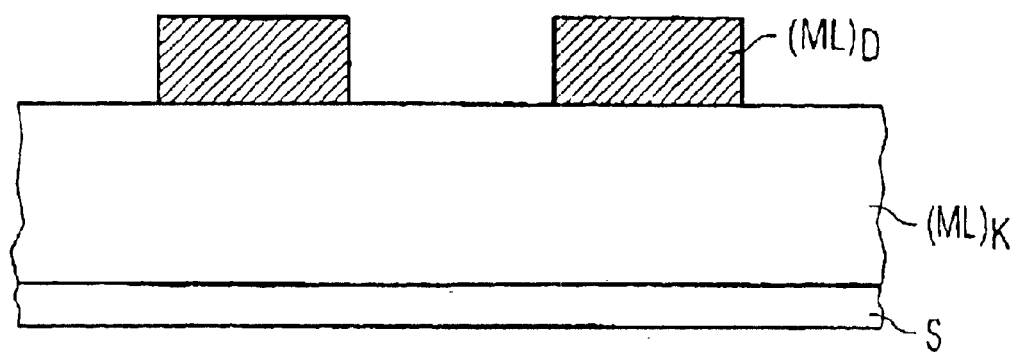

FIGS. 5A to 5C diagrammatically show cross sections through a mask for EUV-lithography (EUVL) with constructive and destructive multilayer layers in different fabrication stages. In this embodiment of an EUVL mask, a patterned multilayer layer $(ML)_D$ for a destructive interference of the reflected partial beams, which locally performs the function of an absorber layer, is situated above an unpatterned multilayer layer $(ML)_K$ for a constructive interference of the reflected partial beams.

In order to fabricate such a mask, the two multilayer layers $(ML)_K$ and $(ML)_D$ are deposited successively on a substrate S. As mentioned further above, these two layer types differ only in the periodicity d of the successive double layers. The multilayer layers $(ML)_K$ and $(ML)_D$ thus both contain, for example, in each case a sequence of Mo/Si double layers which are continuously applied one after the other.

In order to produce the mask blank of FIG. 5A, by sputtering, first the constructive multilayer layer $(ML)_K$ is deposited onto the substrate S, which is composed of, for example, quartz or another material with a low thermal expansion coefficient, and then the destructive multilayer layer $(ML)_D$ is deposited. In this case, the periodicity d satisfies the condition for a constructive and destructive interference of the reflected partial beams that was explained with reference to FIG. 1. The constructive multilayer layer $(ML)_K$ contains, for example, as usual, about 40 Mo/Si double layers each having a thickness of 6.8 nm corresponding to half the wavelength of the EUV-radiation used. The total thickness of the destructive multilayer layer $(ML)_D$ is as small as possible, on the one hand, in order that shadowing effects are kept small, and on the other hand both the total thickness of the destructive multilayer layer $(ML)_D$, that is to say the number of Mo/Si double layers, and the thickness of the Mo and Si individual layers are optimized with regard to a minimum intensity of the reflected radiation.

Photoresist is then applied to the upper, destructive multilayer layer $(ML)_D$ and a photoresist structure P is formed by electron beam lithography (FIG. 5B).

The upper, destructive multilayer layer $(ML)_D$ is patterned by anisotropic plasma etching (for example by RIE, MERIE, ICP using F- or Cl-containing etching gases such as $CF_4$, $CF_4/O_2$, $SF_6$, $Cl_2$, $Cl_2/O_2$, $BCl_3/Cl_2$) using the photoresist structure P as an etching mask. The end point of the etching process, which is as homogeneous as possible, can be ascertained by interferometry by an in-situ measurement of the reflectivity at 13.5 nm or by emission spectroscopy by detection of the number of etched double layers of the multilayer layer $(ML)_D$, the total number of which is known, during the etching.

Removal of the photoresist structure P yields the EUVL mask which is illustrated in FIG. 5C and in which the patterned multilayer layer $(ML)_D$, whose periodicity d satisfies the condition $d=(2n+1)\cdot\lambda/4\cdot\cos\delta$ where $n=0, 1, 2, 3\ldots$ for a destructive interference of the reflected partial beams and which thus almost extinguishes the reflected beams locally, lies on the lower, unpatterned multilayer layer $(ML)_K$, whose periodicity d satisfies the condition $d=n\cdot\lambda/2\cdot\cos\delta$ where $n=1, 2, 3 \ldots$ for a constructive interference of the partial beams reflected at the individual double layers.

FIGS. 6A to 6E diagrammatically show cross sections through a second exemplary embodiment of a mask for EUV lithography with constructive and destructive multilayer layers $(ML)_K$, $(ML)_D$ in different fabrication stages. The second embodiment of an EUVL mask corresponds to the first exemplary embodiment described with reference to FIGS. 5A to 5C, but one or two additional buffer layers for end point identification and/or defect repair are provided in the case of the present second exemplary embodiment.

Figure 6A:
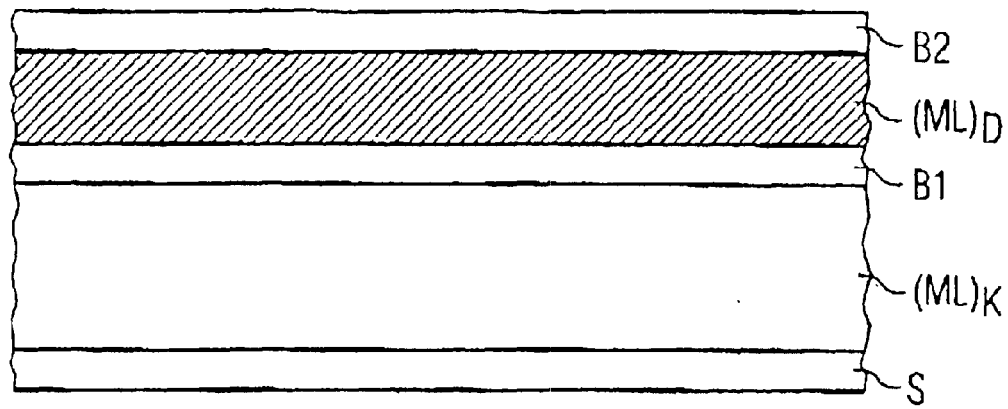
FIGS. 6A to 6E are diagrammatic, cross-sectional views through the mask for EUV-lithography of different fabrication stages, the mask containing the unpatterned constructive multilayer layer, the patterned destructive multilayer layer and one or two patterned auxiliary layers.

In order to fabricate the mask blank of FIG. 6A, by sputtering, first the constructive multilayer layer $(ML)_K$ is deposited onto the substrate S made of quartz, for example, a first buffer layer B1 made of 50 nm $SiO_2$, for example, is deposited onto the multilayer layer, the destructive multilayer layer $(ML)_D$ is deposited onto the first buffer layer B1 and a second buffer layer B2 is in turn deposited onto the multilayer layer. The second buffer layer B2 may contain, for example 50 nm $Si_3N_4$, CVD-C, a polymer, a metallic hard mask made of Ti, Ta, TiN, TaN, Al, W, etc.

The conditions mentioned above hold true again for the periodicity and the composition of the constructive and destructive multilayer layers $(ML)_K$ and $(ML)_D$.

Figure 6B:
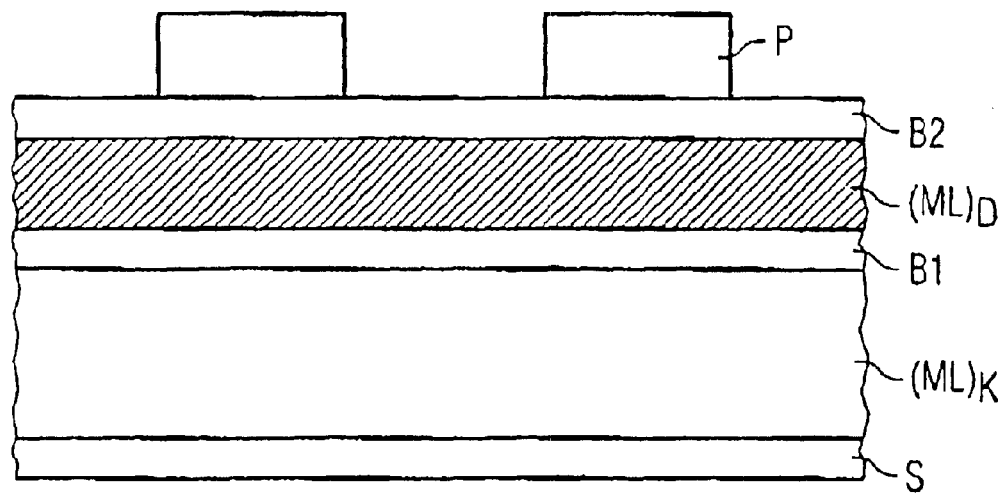

As shown in FIG. 6B, photoresist is then applied to the buffer layer B2 lying at the top and a photoresist structure P is formed by electron beam lithography.

Figure 6C:
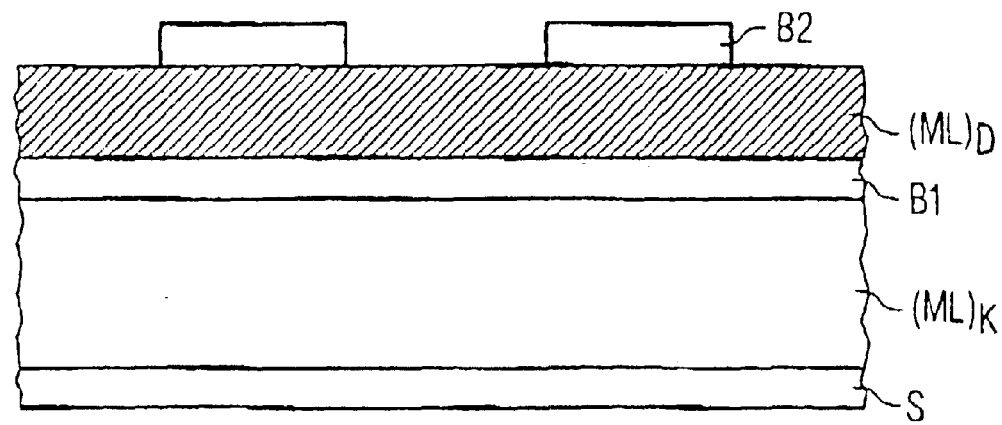

The photoresist structure P is subsequently transferred into the buffer layer B2 by anisotropic and selective plasma etching, for example by RIE, MERIE, ICP, using material-dependent etching gases/etching gas mixtures. Afterward, the photoresist of the photoresist structure P is removed again wet-chemically and/or in the plasma, thereby producing the configuration with the patterned buffer layer B2 above the destructive multilayer layer $(ML)_D$ which is shown in FIG. 6C.

The destructive multilayer layer $(ML)_D$ is thereupon etched anisotropically and selectively with respect to the buffer layer B1 by reactive ion etching (RIE) or the like and using the patterned buffer layer B2 as an etching mask, it being possible to use $CF_4$, $CF_4/O_2$, $SF_6$, $Cl_2$, $Cl_2/O_2$, $BCl_3/Cl_2$, for example, as etching gases.

The buffer layer B1 lying between the destructive multilayer layer $(ML)_D$ and the constructive multilayer layer $(ML)_K$ is subsequently removed selectively with respect to the multilayer layers $(ML)_D$ and $(ML)_K$, for example wet-chemically in dilute HF acid.

Figure 6D:
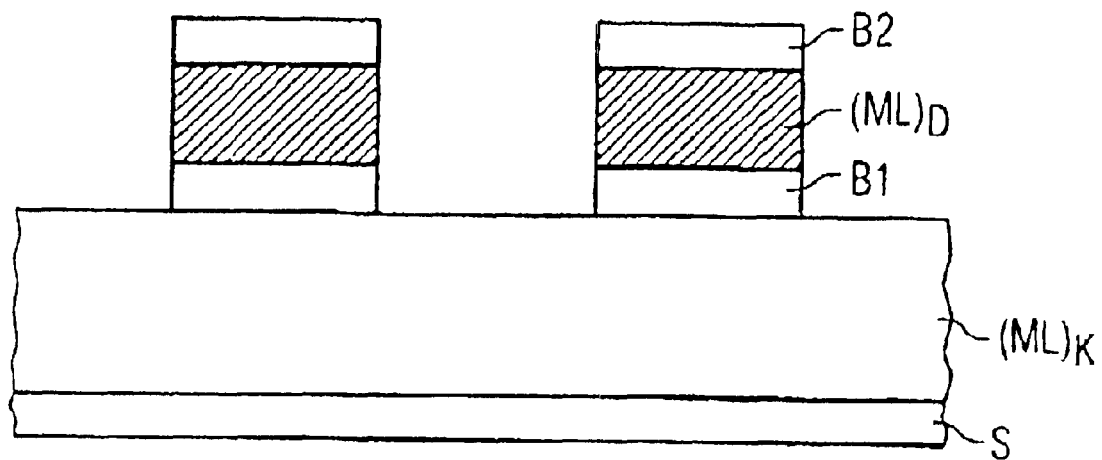
Figure 6E:
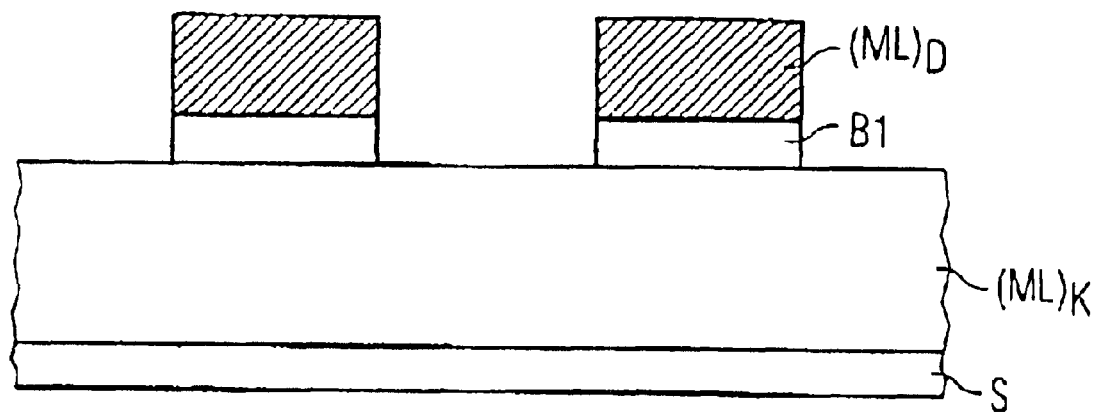

The structure shown in FIG. 6D is thus produced. Removal of the auxiliary or the buffer layer B2 lying at the top then yields the EUVL mask which is illustrated in FIG. 6E and which differs from the mask of FIG. 5C by virtue of the auxiliary or buffer layer B1 lying between the two multilayer layers $(ML)_K$ and $(ML)_D$.

Optionally, one of the two auxiliary or buffer layers B1 and B2 can also be omitted in the case of this embodiment.

Figure 7A:
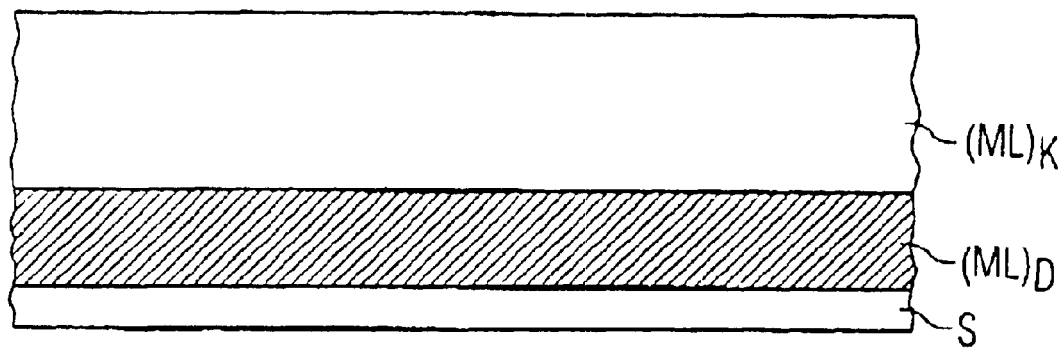
FIGS. 7A to 7C are diagrammatic, cross-sectional views through the mask for EUV-lithography of different fabrication stages, the mask containing a lower, unpatterned destructive multilayer layer and an upper, patterned constructive multilayer layer.
Figure 7B:
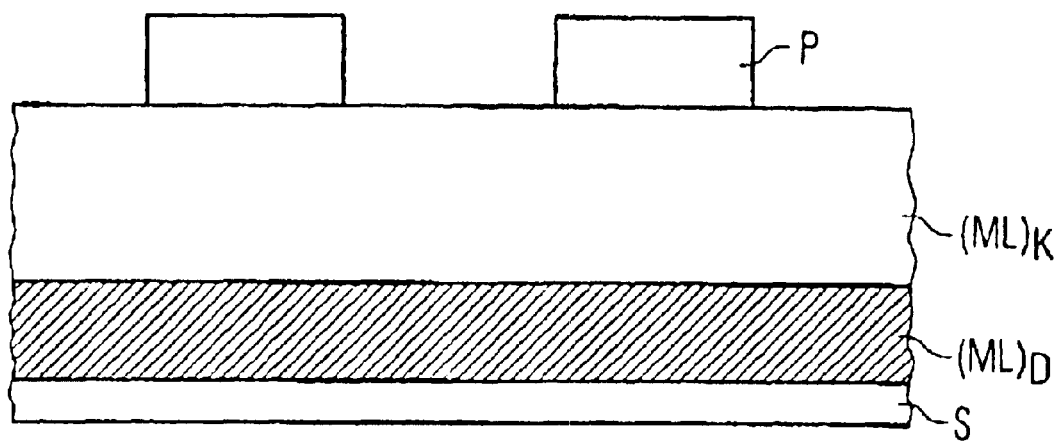
Figure 7C:
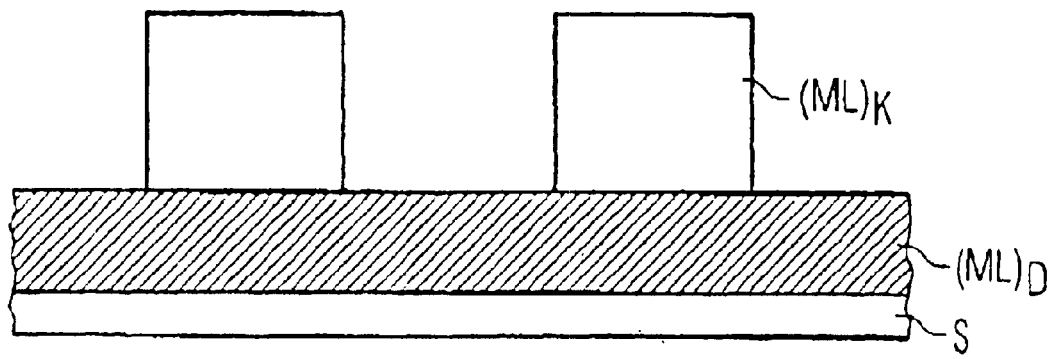

FIGS. 7A to 7C diagrammatically show cross sections through a third embodiment of a mask for EUV-lithography with the constructive and destructive multilayer layers in different fabrication stages. The third embodiment of the EUVL mask corresponds to the first exemplary embodiment described with reference to FIGS. 5A to 5C, but the order of the multilayer layers $(ML)_K$ and $(ML)_D$ is interchanged in the case of the present third exemplary embodiment. Consequently, a patterned multilayer layer $(ML)_K$ for a constructive interference of the reflected partial beams is situated above an unpatterned multilayer layer $(ML)_D$ for a destructive interference of the reflected partial beams. The radiation radiated onto the mask is thus reflected only where the constructive multilayer layer $(ML)_K$ is locally situated.

In order to produce the mask blank of FIG. 7A, by sputtering, first the destructive multilayer layer $(ML)_D$ is deposited onto the substrate S made of quartz, for example, and then the constructive multilayer layer $(ML)_K$ is deposited onto the destructive multilayer layer. Photoresist is then applied to the constructive multilayer layer $(ML)_K$ lying at the top and the photoresist structure P is formed by electron beam lithography, as is shown in FIG. 7B.

Analogously to the first exemplary embodiment, the upper, constructive multilayer layer $(ML)_K$ is then patterned by anisotropic plasma etching, for example by RIE, MERIE, ICP using F- or Cl-containing etching gases such as $CF_4$, $CF_4/O_2$, $SF_6$, $Cl_2$, $Cl_2/O_2$, $BCl_3/Cl_2$, using the photoresist structure P as an etching mask. The end point of the etching process, which is as homogeneous as possible, can again be ascertained by interferometry by an in-situ measurement of the reflectivity at 13.5 nm or by emission spectroscopy by detection of the number of etched double layers in the multilayer layer $(ML)_K$, the total number of which is known, during the etching.

Removal of the photoresist structure P yields the EUVL mask which is illustrated in FIG. 7C and in which the anisotropically patterned, constructive multilayer layer $(ML)_K$, which satisfies the condition $d=n\cdot\lambda/2\cdot\cos\delta$ where $n=1, 2, 3 \ldots$ for a constructive interference of the partial beams reflected at the individual double layers, so that it selectively reflects back the radiated-in radiation, lies on the lower, unpatterned, destructive multilayer layer $(ML)_D$, which satisfies the condition $d=(2n+1)\cdot\lambda/4\cdot\cos\delta$ where $n=0, 1, 2, 3 \ldots$ for a destructive interference of the reflected partial beams and thus, where it is uncovered, prevents a reflection of the radiated-in radiation.

This embodiment has the particular advantages that the shadowing is minimal and that smaller thermal stresses and distortions occur. Possible defects can be removed between the structures of the constructive multilayer layer $(ML)_K$.

FIGS. 8A to 8F diagrammatically show cross sections through a fourth exemplary embodiment of a mask for EUV-lithography with constructive and destructive multilayer layers $(ML)_K$, $(ML)_D$ and one or two additional buffer layers B1, B2 for end point identification and/or defect repair in different fabrication stages. The fourth embodiment of an EUVL mask corresponds to the second exemplary embodiment described with reference to FIGS. 6A to 6E, but, similarly to the third exemplary embodiment, the order of the constructive and destructive multilayer layers $(ML)_K$ and $(ML)_D$ is interchanged in the case of the present fourth exemplary embodiment.

Figure 8A:
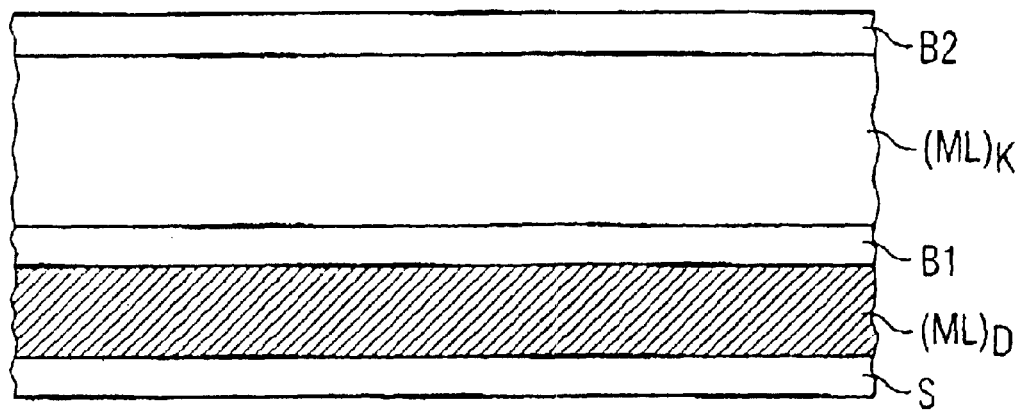
FIGS. 8A to 8F are diagrammatic, cross-sectional views through the mask for EUV-lithography of different fabrication stages in the case of a fabrication process corresponding to FIGS. 6A to 6E, but where the order of the constructive and destructive multilayer layers is interchanged.

In order to fabricate the mask blank of FIG. 8A, therefore, by sputtering, first the destructive multilayer layer $(ML)_D$ is deposited onto the substrate S made of quartz, for example, the first buffer layer B1 made of $SiO_2$, for example, is deposited onto the multilayer layer, the constructive multilayer layer $(ML)_K$ is then deposited onto the first buffer layer, and, finally, the second buffer layer B2 is deposited onto the constructive multilayer layer.

Figure 8B:
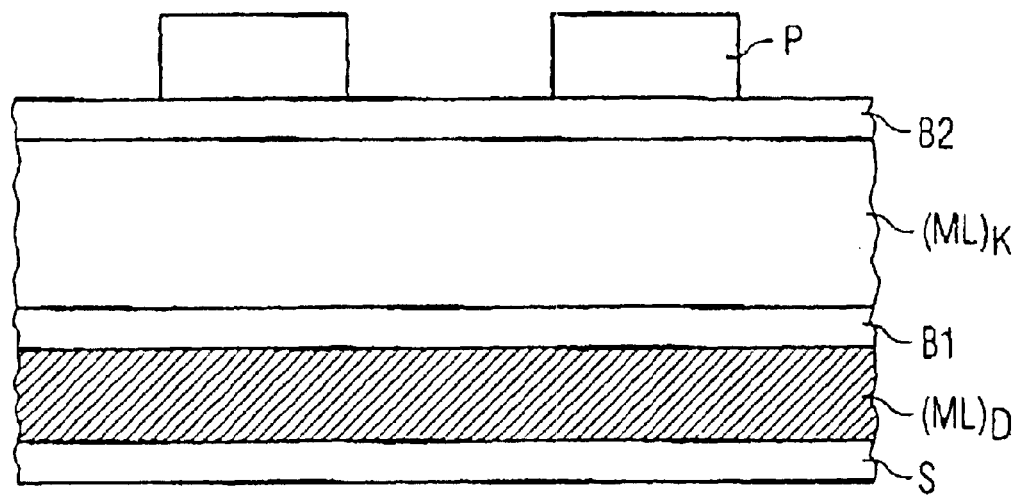

As shown in FIG. 8B, photoresist is then applied to the buffer layer B2 lying at the top and the photoresist structure P is formed by electron beam lithography.

Figure 8C:
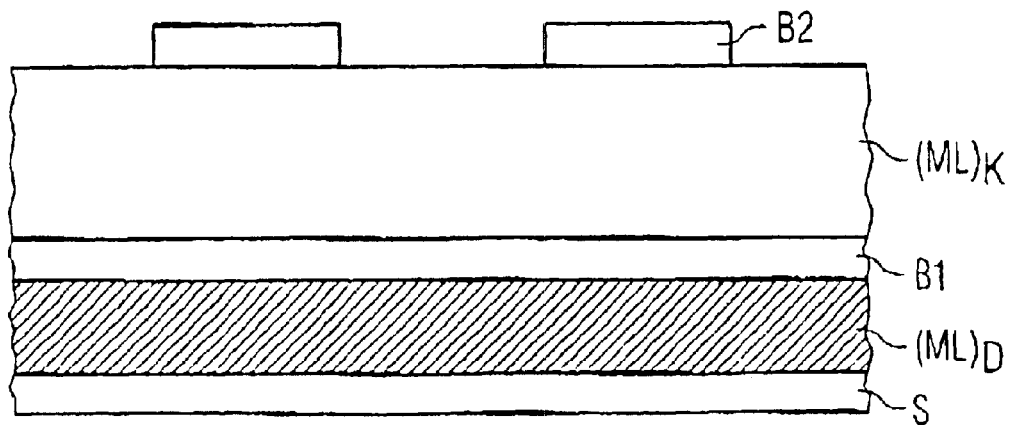

Afterward, the photoresist structure P is transferred into the buffer layer B2 by anisotropic and selective plasma etching and the photoresist of the photoresist structure P is removed again, thereby producing the configuration with the patterned buffer layer B2 above the constructive multilayer layer $(ML)_K$ which is shown in FIG. 8C.

Figure 8D:
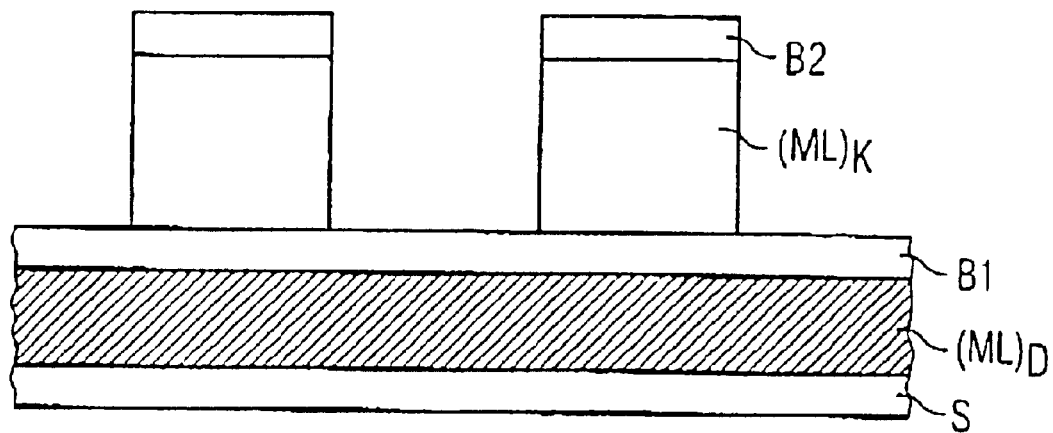

The constructive multilayer layer $(ML)_K$ is thereupon etched anisotropically and selectively with respect to the underlying buffer layer B1 using the patterned buffer layer B2 as an etching mask, thereby producing the structure shown in FIG. 8D.

Figure 8E:
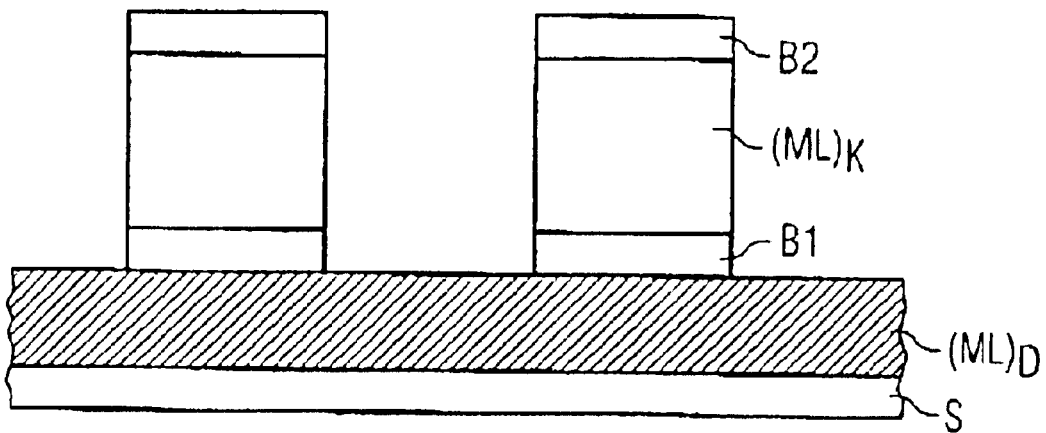
Figure 8F:
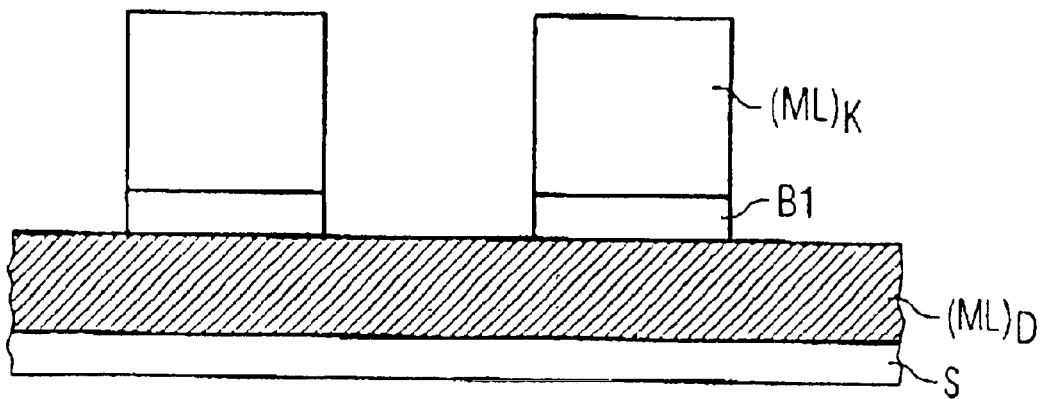

Afterward, the buffer layer B1 is etched selectively with respect to the multilayer layers $(ML)_D$ and $(ML)_K$ and using the patterned multilayer layer $(ML)_D$ as an etching mask. The structure shown in FIG. 8E is thus produced. Removal of the buffer layer B2 lying at the top then yields the EUVL mask which is illustrated in FIG. 8F.

The fourth embodiment has the same particular advantages as the third embodiment, that is to say it has little shadowing and small thermal stresses and distortions. Defects between the $(ML)_K$ structures can be eliminated relatively easily.

We claim:

1. A reflection mask for photolithography, comprising:

a first multilayer layer for reflecting radiated-in radiation by constructive interference of reflected partial beams; and a second multilayer layer having a periodicity effecting a destructive interference of the reflected partial beams and leading to a local absorption of the radiated-in radiation by said second multilayer layer.

2. The reflection mask according to claim 1, further comprising a substrate, said first multilayer layer being an unpatterned multilayer layer for the constructive interference of the reflected partial beams and disposed on said substrate, and said second multilayer being a patterned multilayer layer for the destructive interference of the reflected partial beams and disposed on said first multilayer layer.

3. The reflection mask according to claim 2, further comprising a buffer layer lying between said unpatterned and patterned multilayer layers.

4. The reflection mask according to claim 3, further comprising a further patterned buffer layer lying on said patterned multilayer layer and said further patterned buffer layer serving as an etching mask for the patterning of said patterned multilayer layer and is useful for defect repair.

5. The reflection mask according to claim 1, further comprising a substrate, said second multilayer layer being an unpatterned multilayer layer for the destructive interference of the reflected partial beams and disposed on said substrate, said first multilayer layer being a patterned multilayer layer for the constructive interference of the reflected partial beams and disposed on said second multilayer layer.

6. The reflection mask according to claim 5, further comprising a buffer layer lying between said unpatterned and patterned multilayer layers.

7. The reflection mask according to claim 6, further comprising a further patterned buffer layer lying on said patterned multilayer layer and said further patterned buffer layer serving as an etching mask for the patterning of said patterned multilayer layer and is useful for defect repair.

8. A method for fabricating a reflection mask according to claim 1, which comprises the steps of:
- providing a substrate;
- applying a first multilayer layer to the substrate;
- applying a second multilayer layer on the first multilayer layer;
- forming a photoresist structure on the second multilayer layer;
- patterning the second multilayer layer using the photoresist structure as a mask resulting in a second, patterned multilayer layer; and
- removing the photoresist structure.

9. The method according to claim 8, which comprises providing the first multilayer layer for a constructive interference of reflected partial beams and the second, patterned multilayer layer for a destructive interference of the reflected partial beams.

10. The method according to claim 9, which comprises forming a buffer layer between the first multilayer layer and the second multilayer layer.

11. The method according to claim 8, which comprises:
- forming a first buffer layer after an application of the first multilayer layer on the first multilayer layer; and
- forming a second buffer layer formed after an application of the second multilayer layer on the second multilayer layer.

12. The method according to claim 8, which comprises providing the first multilayer layer for a destructive interference of reflected partial beams and the second, patterned multilayer layer for a constructive interference of the reflected partial beams.

13. The method according to claim 12, which comprises forming a buffer layer between the first multilayer layer and the second multilayer layer.

* * * * *